(12) United States Patent
Urimoto et al.

(10) Patent No.: US 11,005,197 B2
(45) Date of Patent: May 11, 2021

(54) CONTROL UNIT HAVING PRESS-FIT STRUCTURE

(71) Applicant: Mitsubishi Electric Corporation, Tokyo (JP)

(72) Inventors: Kentaro Urimoto, Tokyo (JP); Takahisa Kawaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/489,902

(22) PCT Filed: Mar. 6, 2017

(86) PCT No.: PCT/JP2017/008781
§ 371 (c)(1),
(2) Date: Aug. 29, 2019

(87) PCT Pub. No.: WO2018/163246
PCT Pub. Date: Sep. 13, 2018

(65) Prior Publication Data
US 2020/0067214 A1    Feb. 27, 2020

(51) Int. Cl.
*H01R 12/58*    (2011.01)
*H05K 1/18*    (2006.01)

(52) U.S. Cl.
CPC .............. *H01R 12/585* (2013.01); *H05K 1/18* (2013.01); *H05K 2201/1059* (2013.01)

(58) Field of Classification Search
CPC ...... H01R 12/585; H01R 13/41; H01R 12/51; H01R 13/631; H01R 12/55; H01R 12/58;
(Continued)

(56) References Cited

U.S. PATENT DOCUMENTS

| | | | |
|---|---|---|---|
| 4,017,143 A | 4/1977 | Knowles | |
| 6,305,949 B1 * | 10/2001 | Okuyama | H01R 12/585 439/75 |

(Continued)

FOREIGN PATENT DOCUMENTS

| | | |
|---|---|---|
| JP | 60-008586 B2 | 3/1985 |
| JP | 63-031570 U | 3/1988 |

(Continued)

OTHER PUBLICATIONS

Extended European Search Report dated Jan. 29, 2020 in European Application No. 17899708.6.

(Continued)

*Primary Examiner* — Travis S Chambers
(74) *Attorney, Agent, or Firm* — Sughrue Mion, PLLC; Richard C. Turner

(57) ABSTRACT

In a control unit having a press-fit structure, a substrate includes: a connected portion to which the press-fit terminal is connected; and a guide portion extending from the substrate around the connected portion. The press-fit terminal includes: a tip end portion; a contact portion adjacent to the tip end portion; and an enlarged portion. The guide portion includes: an opening portion; a guide hole extending from the opening portion to the substrate; a tapered surface formed on an inner side of the opening portion; and a reduced-hole portion formed continuous to the tapered surface. The tip end portion of the press-fit terminal is configured such that the contact portion is positioned with respect to the connected portion while the enlarged portion is guided by the tapered surface and an inner wall of the reduced-hole portion.

18 Claims, 7 Drawing Sheets

(58) Field of Classification Search
CPC ........ H01R 12/00; H01R 12/718; H05K 1/18; H05K 2201/1059; Y10S 439/943
USPC ..................... 439/733.1, 78, 81, 82, 84, 943
See application file for complete search history.

(56) References Cited

U.S. PATENT DOCUMENTS

| | | | |
|---|---|---|---|
| 6,688,895 B1 | 2/2004 | Fan | |
| 8,715,009 B2* | 5/2014 | Wu | ........................ H01R 12/82 |
| | | | 439/637 |
| 10,727,619 B2* | 7/2020 | Urimoto | ................ H05K 3/308 |
| 2001/0031567 A1* | 10/2001 | Orui | ..................... H01R 43/205 |
| | | | 439/74 |
| 2006/0035492 A1* | 2/2006 | Sekido | ............... H01R 13/6658 |
| | | | 439/100 |
| 2014/0349511 A1* | 11/2014 | Ludwig | .................. H01R 13/41 |
| | | | 439/374 |

FOREIGN PATENT DOCUMENTS

| | | |
|---|---|---|
| JP | 2000-260513 A | 9/2000 |
| JP | 2001-307800 A | 11/2001 |
| JP | 2006-060970 A | 3/2006 |
| JP | 4410241 B2 | 2/2010 |
| JP | 2012-169190 A | 9/2012 |

OTHER PUBLICATIONS

International Search Report for PCT/JP2017/008781 dated Apr. 25, 2017 [PCT/ISA/210].

* cited by examiner

CONTROL UNIT HAVING PRESS-FIT STRUCTURE

CROSS REFERENCE TO RELATED APPLICATIONS

This application is a National Stage of Application No. PCT/JP2017/008781 filed Mar. 6, 2017.

Technical Field

The present invention relates to a press-fit terminal and an insertion guide for the press-fit terminal of a control unit having a press-fit structure.

Background Art

Hitherto, there has been known a method of press-fit connection by press-fit terminals as a technology for connecting, for example, a wiring substrate including circuit substrates or bus bars to terminals of a connector. The press-fit terminals include tip end portions each having a shape to be press-fitted. The tip end portions are press-fitted into conductive insertion holes formed in the wiring substrate to electrically and mechanically connect the terminals to the substrate, and the terminals to the bus bars. Related-art press-fit terminals include tip end portions each having an O-shape to be inserted into an insertion hole (for example, see Patent Literatures 1 and 2).

CITATION LIST

Patent Literature

[PTL 1] JP 4410241 B2
[PTL 2] JP 2012-169190 A

SUMMARY OF INVENTION

Technical Problem

The electronic control device disclosed in Patent Literature 1 includes a connector assembly body including a plurality of press-fit terminals, and a circuit substrate having a plurality of through holes. Further, the plurality of press-fit terminals are press-fitted into the plurality of through holes so that the connector assembly body is assembled to the circuit substrate. Accordingly, it has been difficult to align positions of the tip ends of the plurality of press-fit terminals with positions of the plurality of through holes.

The present invention has been made to solve the above-mentioned problem, and provides a control unit having a press-fit structure capable of simplifying positioning of a plurality of press-fit terminals and a plurality of through holes formed in a substrate, and of improving ease of assembly.

Solution to Problem

According to one embodiment of the present invention, there is provided a control unit having a press-fit structure, the control unit including a connector assembly body and a substrate assembled to each other, the connector assembly body including: a terminal; and a press-fit terminal formed at a tip end of the terminal, the substrate including: a connected portion to which the press-fit terminal is connected; and a guide portion extending from the substrate around the connected portion, the press-fit terminal including: a tip end portion; a contact portion adjacent to the tip end portion; and a first enlarged portion formed on the terminal side of the contact portion, the guide portion including: an opening portion opening in a direction in which the press-fit terminal is inserted; a guide hole extending from the opening portion to the substrate; a tapered surface, which is formed on an inner side of the opening portion, and has an inner dimension decreasing as separating away from the opening portion; and a reduced-hole portion formed continuous to the tapered surface, the tip end portion of the press-fit terminal being configured such that the contact portion is positioned with respect to the connected portion while the first enlarged portion is guided by the tapered surface and an inner wall of the reduced-hole portion.

Advantageous Effects of Invention

According to the present invention, in the control unit having a press-fit structure, the respective guide portions are formed for the respective connected portions of the substrate to which the plurality of press-fit terminals of the connector assembly body are connected. Further, the tip end portion of each press-fit terminal is guided by the guide portion into each connected portion of the substrate. With this structure, the positioning of the tip end portions of the plurality of press-fit terminals of the connector assembly body and the plurality of connected portions of the substrate can easily be performed. Accordingly, ease of assembly of the connector assembly body and the substrate can be improved.

DESCRIPTION OF EMBODIMENTS

Now, with reference to the drawings, a control unit having a press-fit structure according to exemplary embodiments of the present invention is described.

FIRST EMBODIMENT

Figure 1:
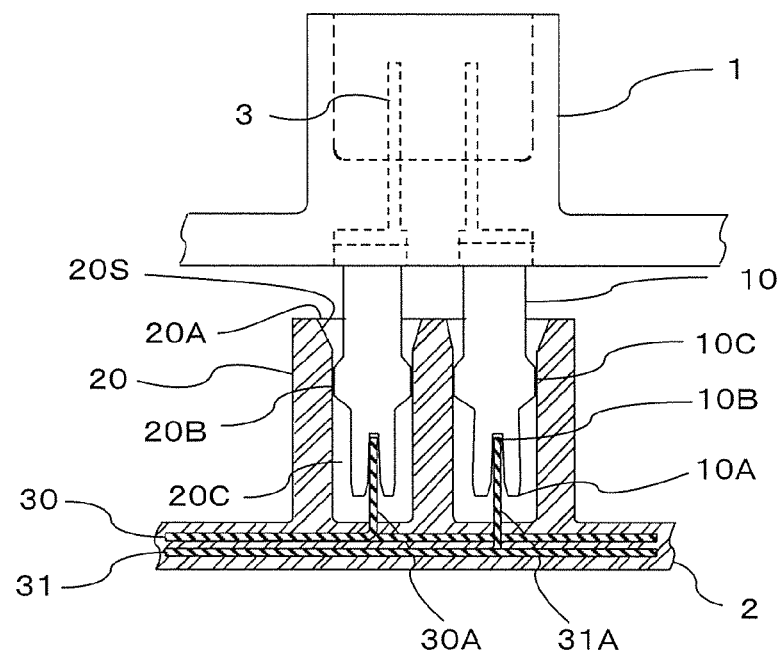
FIG. 1 is a sectional view of a control device having a press-fit structure according to a first embodiment of the present invention for illustrating a state in which a connector assembly body is assembled to a substrate as viewed from a front side of the control device.
Figure 2:
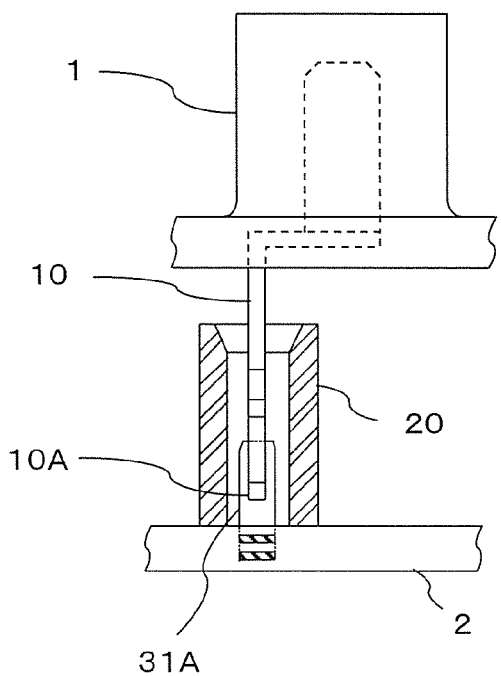
FIG. 2 is a sectional view of the first embodiment for illustrating the state in which the connector assembly body is assembled to the substrate as viewed from a side of the control device.

FIG. 1 is a sectional view of a control device having a press-fit structure according to a first embodiment of the present invention for illustrating a state in which a connector assembly body 1 is assembled to a substrate 2 as viewed from a front side of the control device. Further, FIG. 2 is a sectional view for illustrating the state in which the connector assembly body is assembled to the substrate as viewed from a side of the control device. As illustrated in FIG. 1, the control device according to the first embodiment includes the connector assembly body 1 and the substrate 2.

The connector assembly body 1 includes a plurality of terminals 3 coupled to the connector assembly body 1 by, for example, insert molding. One end side of each terminal 3 protrudes from the connector assembly body 1, and is formed as a connector terminal to be connected to a connector (not shown) of the control device. Meanwhile, another end side thereof of each terminal 3 protrudes from the connector assembly body 1 to a side opposite to the one end side, and a press-fit terminal 10 is formed thereon.

The terminals 3 and the press-fit terminals 10 are formed of metal plates such as copper plates, which are formed by being cut and bent and each have a rectangular cross-section. In FIG. 1, only two terminals 3 are illustrated. However, the number of terminals 3 is not limited to two.

The substrate 2 is made of an insulating resin. Further, the substrate 2 includes a plurality of bus bars 30 and 31 formed of, for example, copper plates by insert molding or the like. The bus bars 30 and 31 are branched off in the substrate 2 to form a plurality of bus bar terminals 30A and 31A protruding from the substrate 2. The bus bars 30 and 31 are bent to form the bus bar terminals 30A and 31A, and the bus bar terminals 30A and 31A each have a rectangular cross-section.

Further, the substrate 2 includes a guide portion 20 extending from the substrate 2. The guide portion 20 includes opening portions 20A and guide holes 20C. The opening portions 20A open in a direction in which the press-fit terminals 10 are inserted. The guide holes 20C extend from the opening portions 20A to the substrate 2. The bus bar terminals 30A and 31A each protrude in the guide holes 20C. Here, the guide portion 20 illustrated in FIG. 1 is molded integrally with the substrate 2, but may be a separate member to be coupled.

The press-fit terminals 10 are inserted into the guide holes 20C of the guide portion 20 to be connected to the bus bar terminals 30A and 31A of the substrate 2. Thus, the connector assembly body 1 is electrically connected to the substrate 2 through intermediation of the terminals 3, the press-fit terminals 10, the bus bar terminals 30A and 31A, and the bus bars 30 and 31.

In each opening portion 20A of the guide hole 20C, a tapered surface 20S is formed to have an inner dimension decreasing as separating away from the opening portion 20A. A reduced-hole portion 20B is formed starting from the tapered surface 20S to a bottom portion of the guide hole 20C.

On the terminal 3 side of each press-fit terminal 10, an enlarged portion 100 is formed to have a width larger than that of a tip end portion 10A. Further, a notched portion 10B is formed in the tip end portion 10A of the press-fit terminal 10. The bus bar terminals 30A and 31A are press-fitted into the notched portions 10B to be electrically and mechanically connected to the press-fit terminals 10.

As illustrated in FIG. 1 and FIG. 2, the tip end portions 10A of the press-fit terminals 10 are connected to the bus bar terminals 30A and 31A so that both surfaces of the press-fit terminals 10 and the bus bar terminals 30A and 31A are arranged orthogonal to each other. Thus, positional shift of the press-fit terminals 10 in a width direction of the bus bar terminals 30A and 31A is allowed within a width of the bus bar terminals 30A and 31A.

Next, with reference to FIG. 3A to FIG. 3D, shapes of the press-fit terminals 10 and the guide portion 20 are described in more detail. FIG. 3A to FIG. 3D are views for illustrating processes for assembling the press-fit terminals according to the first embodiment to the substrate.

Figure 3A:
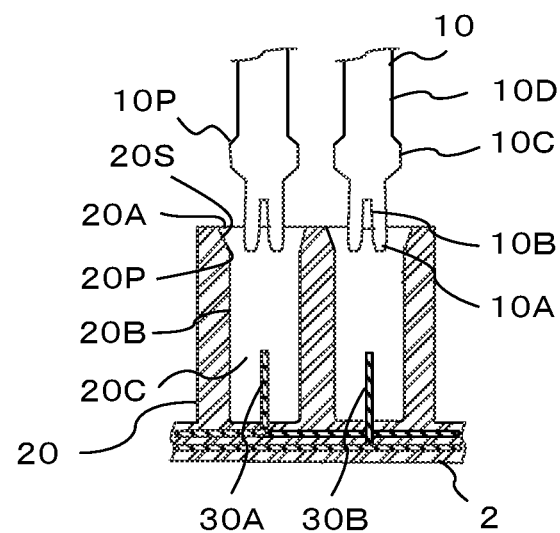
FIG. 3A to FIG. 3D are views for illustrating processes for assembling press-fit terminals of the first embodiment to the substrate.

FIG. 3A is a view for illustrating a state before assembling the connector assembly body 1 to the substrate 2. The tip end portion 10A of each press-fit terminal 10 of the connector assembly body 1 is positioned in each opening portion 20A of the guide portion 20 of the substrate 2.

The plurality of press-fit terminals 10 of the connector assembly body 1 are arranged to correspond to positions of the opening portions 20A of the guide portion 20 of the substrate 2, respectively. Accordingly, when there is no abnormality such as large bend or deformation in each press-fit terminal 10, as illustrated in FIG. 3A, the tip end portion 10A of each press-fit terminal 10 is positioned in a vicinity of a center of each opening portion 20A of the guide portion 20.

At the position of FIG. 3A, when the tip end portions 10A of the press-fit terminals 10 are brought into contact with outer sides of the opening portions 20A of the guide portion 20, the press-fit terminals 10 are determined to have abnormality such as large bend or deformation. To detect such abnormality, when the press-fit terminals 10 are inserted into the guide portion 20, it is preferred to monitor a force applied to the press-fit terminals 10.

For example, with use of a pressure sensor, a reaction force is measured, which is applied from the guide portion 20 to the press-fit terminals 10. Then, based on the measured values of the pressure sensor at a normal time and at an abnormal time, a threshold value is set for the measured values, thereby being capable of detecting abnormality. When the abnormality is detected, it is preferred that assembly work or an operation of an assembling device be stopped while the abnormality is informed to an operator by an alert or the like. Further, it is preferred that, after the press-fit terminal 10 having abnormality is replaced or repaired, the assembly work or the operation of the assembling device be resumed. Thus, assembly failure of the connector assembly body 1 to the substrate 2 can be prevented.

Figure 3B:
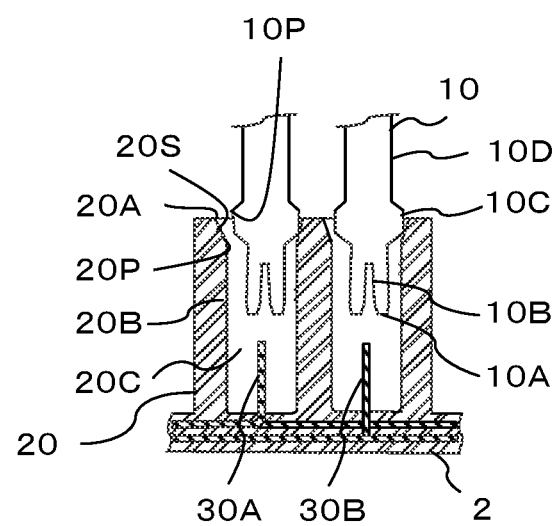

FIG. 3B is a view for illustrating a state in which the tip end portion 10A of each press-fit terminal 10 is inserted into the reduced-hole portion 20B of the guide portion 20. A position of each press-fit terminal 10 may vary within a machining tolerance of the press-fit terminal 10 and a mounting tolerance to the connector assembly body 1, even when there is no abnormality such as large bend or deformation in each press-fit terminal 10.

When the positions of the press-fit terminals 10 vary, as illustrated in FIG. 3B, the tip end portions 10A or enlarged portions 10C of the press-fit terminals 10 may be brought into contact with the tapered surfaces 20S. As the press-fit terminals 10 is inserted into the guide portion 20, the tip end portions 10A or the enlarged portions 10C in contact with the tapered surfaces 20S are moved along the tapered surfaces 20S to be guided to the reduced-hole portions 20B.

Figure 3C:
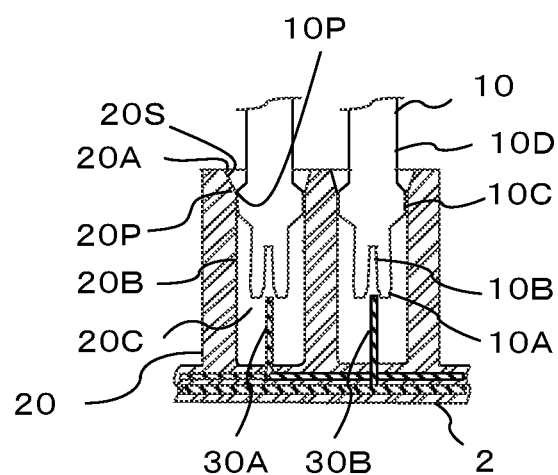

FIG. 3C is a view for illustrating a state in which the press-fit terminals 10 are further inserted, and the tip end portions 10A of the press-fit terminals 10 have reached vicinities of tip ends of the bus bar terminals 30A and 31A.

As illustrated in FIG. 3C, when the enlarged portions 10C of the press-fit terminals 10 are brought into contact with the reduced-hole portions 20B of the guide portion 20, insertion resistance of the press-fit terminals 10 is increased.

Figure 3D:
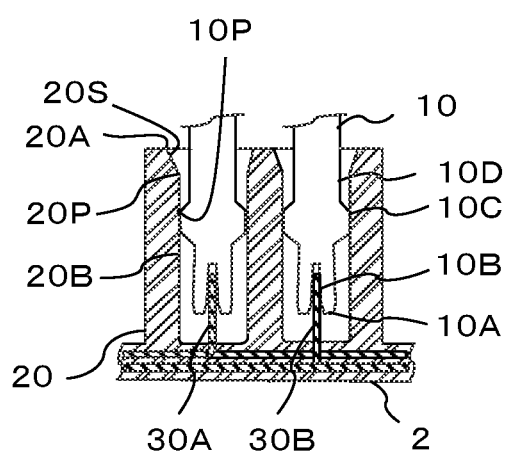

FIG. 3D is a view for illustrating a state in which the press-fit terminals 10 are further inserted from the state of FIG. 3C, and the bus bar terminals 30A and 31A are press-fitted into the notched portions 10B. When the bus bar terminals 30A and 31A are press-fitted into the notched portions 10B, the insertion resistance of the press-fit terminals 10 is further increased from the state of FIG. 3C. Thus, to reduce the insertion resistance when the bus bar terminals 30A and 31A are press-fitted into the notched portions 10B, reduced portions 10D are formed in the press-fit terminals 10.

The reduced portions 10D are formed from the enlarged portions 10C of the press-fit terminals 10 toward the terminals 3 side. Further, the reduced portions 10D are formed such that, when the tip end portions 10A of the press-fit terminals 10 reach the vicinities of the tip ends of the bus bar terminals 30A and 31A, boundaries 10P between the enlarged portions 10C and the reduced portions 10D approximately match with positions of boundaries 20P between the tapered surfaces 20S and the reduced-hole portions 20B.

Thus, until the bus bar terminals 30A and 31A are press-fitted into the notched portions 10B, contact areas between the reduced-hole portions 20B and the enlarged portions 10C are not increased. Therefore, as compared to a case in which the reduced portions 10D are not formed in the press-fit terminals 10, the insertion resistance of the press-fit terminals 10 is reduced.

In a case in which there is abnormal bend or deformation only in the tip end portions 10A of the press-fit terminals 10 and in which the tip end portions 10A are not brought into contact with the opening portions 20A and the reduced-hole portions 20B at the positions of FIG. 3A and FIG. 3B, the abnormality cannot be detected by the pressure sensor. In such a case, a change in insertion resistance from the position of FIG. 3B to the position of FIG. 3C may be measured to detect abnormality of the amount of change.

When the tip end portions 10A of the press-fit terminals 10 are normal, as the bus bar terminals 30A and 31A are inserted into the notched portions 10B, the insertion resistance is gradually increased. Meanwhile, when the tip end portions 10A collide with the bus bar terminals 30A and 31A, the insertion resistance is sharply increased. Further, when the tip end portions 10A are bent largely or are missing, the tip end portions 10A are not brought into contact with the bus bar terminals 30A and 31A, and hence the insertion resistance is not changed. Therefore, the abnormality of the press-fit terminals 10 can be detected based on the amount of change in insertion resistance.

As described above, according to the control device having a press-fit structure of the first embodiment, the plurality of press-fit terminals 10 of the connector assembly body 1 include the tip end portions 10A, the notched portions 10B, the enlarged portions 10C, and the reduced portions 10D. Further, the guide portion 20 of the substrate 2 includes the opening portions 20A each including the tapered surface 20S, and the reduced-hole portions 20B. Further, when the tip end portions 10A or the enlarged portions 10C are brought into contact with the tapered surfaces 20S due to positional shift of the press-fit terminals 10, the tip end portions 10A or the enlarged portions 10C are moved along the tapered surfaces 20S to be guided to the reduced-hole portions 20B. Thus, even when there is positional shift within a tolerance in positions of the press-fit terminals 10, the tip end portions 10A of the press-fit terminals 10 can reach the bus bar terminals 30A and 31A. Thus, the positioning of the press-fit terminals 10 to the bus bar terminals 30A and 31A can easily be performed, to thereby improve ease of assembly of the connector assembly body 1 and the substrate 2.

Further, according to the control device having a press-fit structure of the first embodiment, the control device is configured such that the guide portion 20 is formed on the substrate 2, and when the connector assembly body 1 is assembled to the substrate 2, the press-fit terminals 10 reach the bus bar terminals 30A and 31A through the guide portion 20. Further, when there is abnormality such as large bend or deformation in the press-fit terminals 10, the press-fit terminals 10 are brought into contact with the guide portion 20 before being brought into contact with the bus bar terminals 30A and 31A. With this configuration, abnormality of the press-fit terminals 10 can be detected before the press-fit terminals 10 are brought into contact with the bus bar terminals 30A and 31A. Consequently, the bus bar terminals 30A and 31A can be prevented from being deformed and damaged due to collision of abnormal press-fit terminals 10 against the bus bar terminals 30A and 31A.

Still further, according to the control device having a press-fit structure of the first embodiment, the reduced portions 10D are formed to be continuous to the enlarged portions 10C of the press-fit terminals 10. Thus, when the bus bar terminals 30A and 31A are press-fitted into the notched portions 10B, there is suppressed an increase in area of the enlarged portions 10C which are brought into contact with the reduced-hole portions 20B. With this configuration, the insertion resistance can be reduced when the bus bar terminals 30A and 31A are press-fitted into the notched portions 10B of the press-fit terminals 10.

SECOND EMBODIMENT

Figure 4:
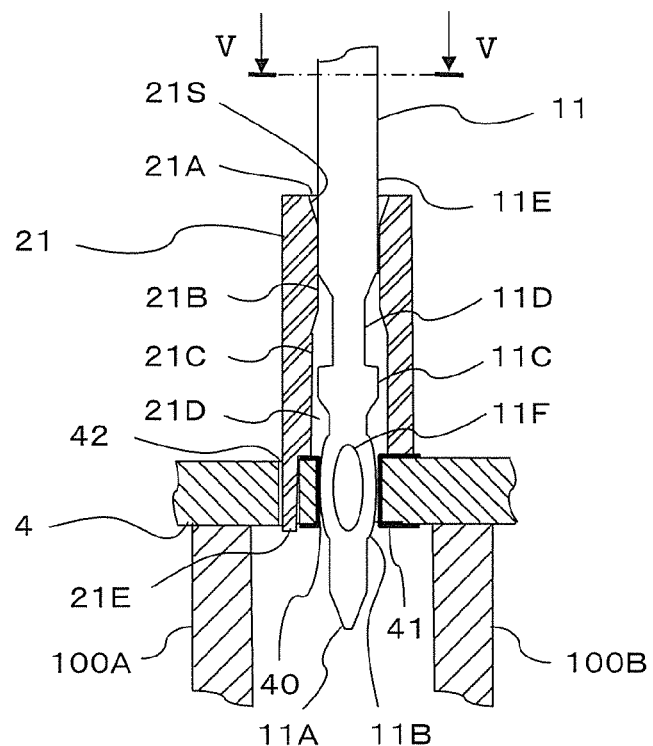
FIG. 4 is a sectional view of a control device having a press-fit structure according to a second embodiment of the present invention for illustrating a state in which a connector assembly body is assembled to a substrate as viewed from a front side of the control device.
Figure 5:
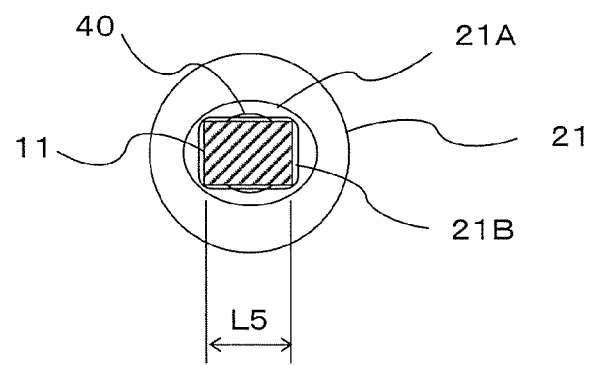
FIG. 5 is a sectional view taken along the line V-V of FIG. 4.
Figure 6:
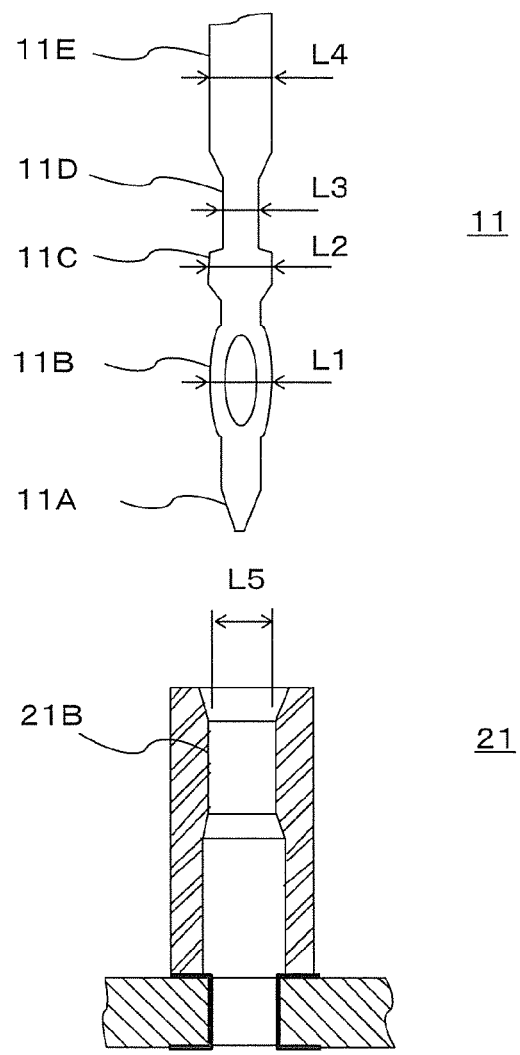
FIG. 6 is a view for illustrating a relationship between a size of each portion of a press-fit terminal of the second embodiment and a size of a reduced-hole portion of a guide portion.
Figure 7A:
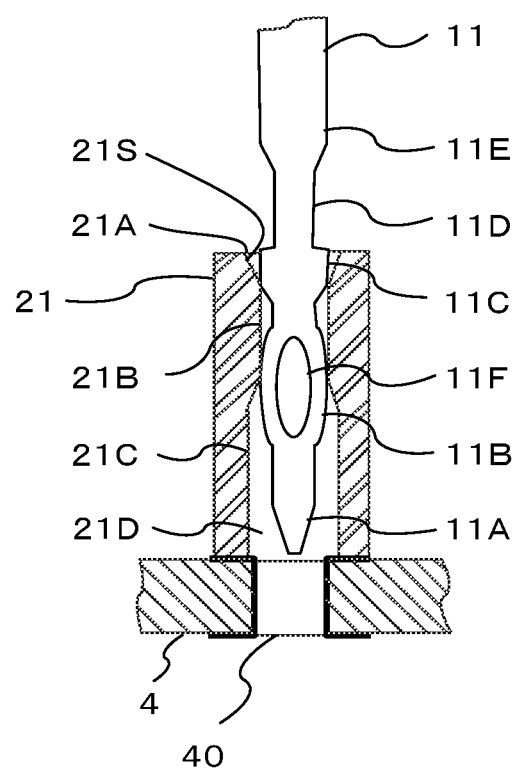
FIG. 7A to FIG. 7C are sectional views for illustrating processes for assembling the press-fit terminal of the second embodiment to the substrate.
Figure 7B:
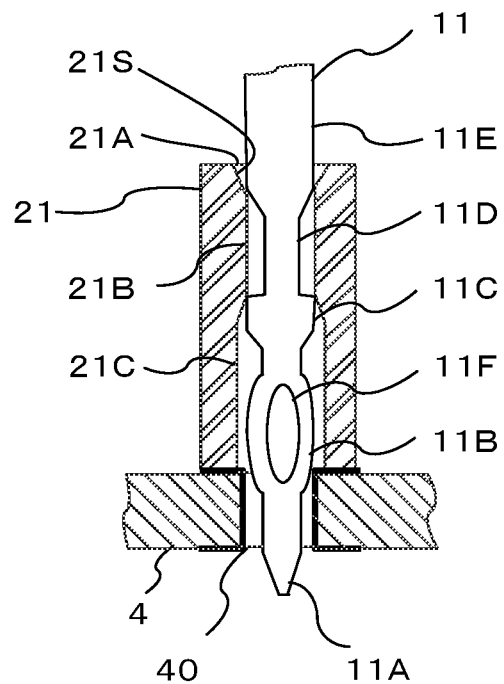
Figure 7C:
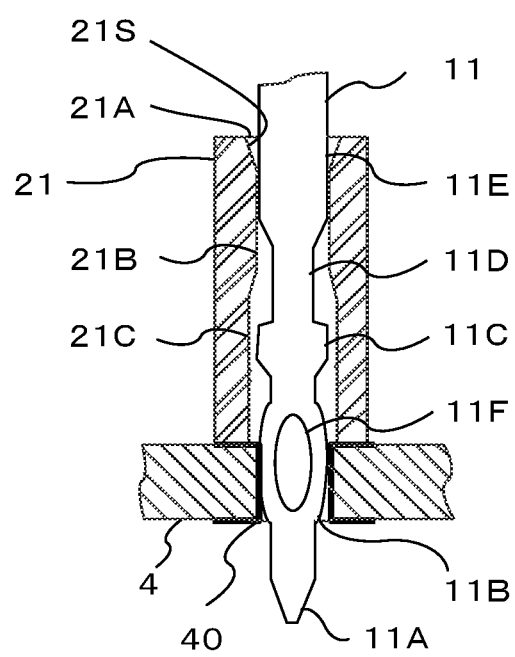

FIG. 4 is a view of the control device having a press-fit structure according to a second embodiment of the present invention for illustrating a state in which a press-fit terminal 11 is assembled to a substrate 4. FIG. 5 is a sectional view taken along the line V-V of FIG. 4. FIG. 6 is a view for illustrating a relationship between a size of each portion of the press-fit terminal 11 and a size of a reduced-hole portion 21B of a guide portion 21. Further, FIG. 7A to FIG. 7C are sectional views for illustrating processes for assembling the press-fit terminal 11 to the substrate 4.

The control device having a press-fit structure according to the second embodiment is different from the first embodiment in a shape of the press-fit terminal 11 and a shape of the guide portion 21. Other structures are the same as those of the first embodiment. In FIG. 4, only one press-fit terminal 11 of a plurality of press-fit terminals 11 included in the connector assembly body 1 is illustrated, but a shape of other press-fit terminals 11 is the same as that of the press-fit terminal 11 of FIG. 4.

In FIG. 4, the terminal 3 (not shown) of the connector assembly body 1 is formed on one end side of the press-fit terminal 11. The substrate 4 is supported by support portions 100A and 100B. The support portions 100A and 100B are configured to prevent the substrate 4 from being deformed and damaged when the press-fit terminal 11 is inserted into the substrate 4. Further, a wiring pattern (not shown) is formed on the substrate 4 on which electronic components are mounted. Further, insertion holes 40 are formed in the substrate 4 as the same number as the plurality of press-fit terminals 11 included in the connector assembly body 1. A conductive portion 41 subjected to plating treatment is formed in each of the plurality of insertion holes 40.

Further, as illustrated in FIG. 4, the guide portion 21 formed by molding an insulating resin is mounted to the substrate 4. Further, a guide hole 21D passing through the guide portion 21 is formed in the guide portion 21. The press-fit terminal 11 is press-fitted into the insertion hole 40 of the circuit substrate 4 through the guide hole 21D.

The guide portion 21 includes a leg portion 21E for positioning on the substrate 4. The leg portion 21E is a rib, which is formed into an arc shape and extends from the guide portion 21. In addition, the substrate 4 has a positioning hole 42. The guide portion 21 is positioned on the substrate 4 through insertion of the leg portion 21E into the positioning hole 42 of the substrate 4. After that, a center of the guide hole 21D is positioned so as to be aligned with a center of the insertion hole 40 through positioning of the guide portion 21 with respect to the substrate 4.

As illustrated in FIG. 4, the press-fit terminal 11 includes a tip end portion 11A having a tapered-off shape, an elastic leg portion 11B, a first enlarged portion 11C, a reduced portion 11D, and a second enlarged portion 11E. The press-fit terminal 11 is formed of a metal plate such as copper, which is formed by being cut and bent and has a rectangular cross-section. The elastic leg portion 11B is formed around a hole 11F passing through in a direction perpendicular to a longitudinal direction of the press-fit terminal 11. The hole 11F of the elastic leg portion 11B is elastically deformed when the press-fit terminal 11 is press-fitted into the insertion hole 40 of the substrate 4, and is electrically and mechanically connected to an inner wall of the insertion hole 40.

The guide hole 21D of the guide portion 21 includes an opening portion 21A, a reduced-hole portion 21B, and an enlarged-hole portion 21C. As illustrated in FIG. 5, the opening portion 21A has an elliptical cross-sectional shape. Further, the reduced-hole portion 21B has a rectangular cross-sectional shape conforming to the cross-sectional shape of the press-fit terminal 11. Still further, the enlarged-hole portion 21C has an elliptical cross-sectional shape. In the reduced-hole portion 21B, it is not always required that entire circumferences of the first enlarged portion 11C and the second enlarged portion 11E of the press-fit terminal 11 be in contact with the inner wall of the reduced-hole portion 21B. Therefore, the cross-sectional shape of the reduced-hole portion 21B may have a relationship of size such that at least one side surface of both the side surfaces of the first enlarged portion 11C and the second enlarged portion 11E is brought into contact with the inner wall. Cross-sectional shapes of the opening portion 21A and the enlarged-hole portion 21C are not limited to an elliptical shape, but may be a rectangular shape, a circular shape, or an elongated circular shape.

Next, shapes of each portion of the press-fit terminal 11 and the guide portion 21 are further described with reference to FIG. 6 and FIG. 7. In FIG. 6, a maximum width of the elastic leg portion 11B of the press-fit terminal 11 is represented by L1, a maximum width of the first enlarged portion 11C is represented by L2, a width of the reduced portion 11D is represented by L3, and a maximum width of the second enlarged portion 11E is represented by L4, there is a relationship of L2≈L4>L1>L3 among L1 to L4.

Meanwhile, an inner dimension of the guide hole 21D has a smallest inner dimension L5 at the reduced-hole portion 21B. The reduced-hole portion 21B has a rectangular cross-sectional shape as illustrated in FIG. 5, and hence the inner dimension L5 of the reduced-hole portion 21B refers to a long side of the reduced-hole portion 21B in cross-section. The inner dimension L5 of the reduced-hole portion 21B is set to a size which allows the first enlarged portion 11C and the second enlarged portion 11E of the press-fit terminal 11 to pass through the reduced-hole portion 21B.

FIG. 7A is a view for illustrating a state in which the press-fit terminal 11 is inserted into the guide hole 21D, and the tip end portion 11A of the press-fit terminal 11 reaches a front of the insertion hole 40 of the substrate 4. A tapered surface 21S is formed in the opening portion 21A of the guide hole 21D similarly to the guide hole 20C of the first embodiment. Further, the width L3 of the reduced portion 11D of the press-fit terminal 11 is set to be smaller than widths of other portions of the press-fit terminal 11, and the reduced portion 11D is easily deformed.

With this configuration, when the position of the press-fit terminal 11 is shifted, and the tip end portion 11A or the first enlarged portion 11C is brought into contact with the tapered surface 21S, the reduced portion 11D is deformed so that the tip end portion 11A and the first enlarged portion 11C are moved along the tapered surface 21S. Further, the tip end portion 11A is guided to a vicinity of the center of the insertion hole 40 of the substrate 4.

FIG. 7B is a view for illustrating a state in which the press-fit terminal 11 is further inserted. As illustrated in FIG. 7B, the first enlarged portion 11C passes through the reduced-hole portion 21B, and the second enlarged portion 11E reaches the opening portion 21A. Further, the tip end portion 11A passes through the insertion hole 40 of the substrate 4. At this moment, a contact area between the press-fit terminal 11 and an inner wall of the guide hole 21D is smallest, and the insertion resistance of the press-fit terminal 11 becomes smallest.

FIG. 7C is a view for illustrating a state in which the press-fit terminal 11 is further inserted and is connected to the substrate 4. As illustrated in FIG. 7C, the second enlarged portion 11E is positioned on the reduced-hole portion 21B, and the elastic leg portion 11B is inserted into the insertion hole 40 of the substrate 4. Consequently, the press-fit terminal 11 is electrically and mechanically connected to the substrate 4. In the state of FIG. 7C, the reduced portion 11D has an effect of absorbing vibration of the control device by being deformed.

As described above, according to the control device having a press-fit structure of the second embodiment, the press-fit terminal 11 includes the tip end portion 11A, the elastic leg portion 11B, the first enlarged portion 11C, the reduced portion 11D, and the second enlarged portion 11E. Further, the guide portion 21 having the guide hole 21D is mounted to the substrate 4, and the guide hole 21D has the opening portion 21A having the tapered surface 21S, and the reduced-hole portion 21B. Further, the tip end portion 11A and the first enlarged portion 11C of the press-fit terminal 11 are moved along the tapered surface 21S of the guide hole 21D to guide the tip end portion 11A to the vicinity of the center of the insertion hole 40 of the substrate 4.

With this configuration, even when there is positional shift within a tolerance in position of the press-fit terminal 11, the tip end portion 11A of the press-fit terminal 11 can be guided to the vicinity of the center of the insertion hole 40 of the substrate 4. Accordingly, the positioning of the press-fit terminal 11 to the insertion hole 40 can easily be performed, to thereby improve ease of assembly of the connector assembly body 1 and the substrate 4.

Further, according to the control device having a press-fit structure of the second embodiment, the control device is configured such that the guide portion 21 is mounted to the substrate 4, and the press-fit terminal 11 reaches the insertion hole 40 of the substrate 4 through the guide portion 21. Further, when there is abnormal bend or deformation in the press-fit terminal 11, the press-fit terminal 11 is brought into contact with the guide portion 21 before being brought into contact with the substrate 4.

With this configuration, abnormality such as bend of the press-fit terminal 11 can be detected before the press-fit terminal 11 is brought into contact with the substrate 4. Accordingly, the substrate 4 can be prevented from being damaged due to collision of abnormal press-fit terminal 11 against the substrate 4.

In the second embodiment, the press-fit terminal 11 includes the tip end portion 11A, the elastic leg portion 11B, the first enlarged portion 11C, the reduced portion 11D, and the second enlarged portion 11E. However, the present invention is not limited thereto. For example, a third enlarged portion may be formed between the second enlarged portion 11E and the terminal 3, and the press-fit terminal 11 may be brought into contact with the opening portion 21A or the reduced-hole portion 21B of the guide hole 21D using the third enlarged portion as a stopper to complete insertion of the press-fit terminal 11.

Thus, the elastic leg portion 11B of the press-fit terminal 11 can easily be positioned into the insertion hole 40 of the substrate 4.

Further, in the second embodiment, one press-fit terminal 11 is inserted into one insertion hole 40. However, the present invention is not limited thereto. For example, two press-fit terminals 11 may be inserted into one insertion hole 40.

Still further, in the second embodiment, the leg portion 21E for positioning is formed in the guide portion 21, and the positioning hole 42 is formed in the substrate 4. However, the present invention is not limited thereto. For example, a positioning pin may be provided on the substrate 4, and may be fitted into a positioning hole formed in the guide portion 21 so that the guide portion 21 is positioned on the substrate 4. Yet further, as in the first embodiment, the guide portion 21 may be molded integrally with the substrate 4.

REFERENCE SIGNS LIST 1 connector assembly body, 2,4 substrate, 10, 11 press-fit terminal, 10A, 11A tip end portion, 10B notched portion (contact portion), 10C enlarged portion (first enlarged portion), 10D, 11D reduced portion, 11B elastic leg portion (contact portion), 11C first enlarged portion, 11E second enlarged portion, 11F hole, 20,21 guide portion, 20A, 21A opening portion, 20B, 21B reduced-hole portion, 20C, 21D guide hole, 20S, 21S tapered surface, 21C enlarged-hole portion, 30, 31 bus bar, 30A, 31A bus bar terminal (connected portion), 40 insertion hole (connected portion), 41 conductive portion (conductive member), 100A, 100B support portion

The invention claimed is:

1. A control unit having a press-fit structure, comprising a connector assembly body and a substrate assembled to each other,
the connector assembly body including:
a terminal; and
a press-fit terminal formed at a tip end of the terminal, the substrate including:
a connected portion to which the press-fit terminal is connected, the connected portion including an insertion hole formed in the substrate; and
a guide portion extending from the substrate around the connected portion,
the press-fit terminal including:
a tip end portion;
a contact portion, which is adjacent to the tip end portion, and is to be connected to the connected portion; and
a first enlarged portion formed on the terminal side of the contact portion,
the guide portion including:
an opening portion opening in a direction in which the press-fit terminal is positioned;
a guide hole extending from the opening portion to the substrate;
a tapered surface, which is formed on an inner side of the opening portion, and has an inner dimension decreasing as separating away from the opening portion; and
a reduced-hole portion formed continuous to the tapered surface,
the tip end portion of the press-fit terminal being configured such that the contact portion is positioned with respect to the connected portion while the first enlarged portion is guided by the tapered surface and an inner wall of the reduced-hole portion,
wherein the press-fit terminal includes a reduced portion formed on a terminal side of the first enlarged portion, the reduced portion having a width smaller than a width of the first enlarged portion,
wherein the press-fit terminal includes a second enlarged portion formed on a terminal side of the reduced portion,
wherein the first enlarged portion and the second enlarged portion are guided by the inner wall of the reduced-hole portion to be inserted into the guide portion, and
wherein, when the first enlarged portion is positioned at the reduced-hole portion, the tip end portion is positioned in the insertion hole.

2. The control unit having a press-fit structure according to claim 1,
wherein the contact portion comprises a notch formed in the tip end portion,
wherein the connected portion comprises a terminal extending perpendicularly from the substrate, and
wherein the connector assembly body is connected to the substrate through engagement between the notch and the terminal.

3. The control unit having a press-fit structure according to claim 1,
wherein the connector assembly body includes a plurality of press-fit terminals, and
wherein the guide portion has a plurality of guide holes as the same number as the plurality of press-fit terminals.

4. The control unit having a press-fit structure according to claim 1,
wherein the guide portion includes a fitting portion,
wherein the substrate includes a fitted portion, and
wherein the guide portion is positioned on the substrate through fitting of the fitting portion to the fitted portion.

5. The control unit having a press-fit structure according to claim 1, wherein the guide portion is molded integrally with the substrate.

6. The control unit having a press-fit structure according to claim 1, wherein the press-fit terminal includes a reduced portion having a width smaller than a width of the first enlarged portion, and wherein the reduced portion is formed between the first enlarged portion and the terminal.

7. The control unit having a press-fit structure according to claim 6, wherein, when a boundary between the first enlarged portion and the reduced portion of the press-fit terminal is positioned at a boundary between the tapered surface and the reduced-hole portion of the guide portion, the tip end portion of the press-fit terminal is positioned at the connected portion.

8. The control unit having a press-fit structure according to claim 6, wherein the contact portion comprises a notch formed in the tip end portion, wherein the connected portion comprises a terminal extending perpendicularly from the substrate, and wherein the connector assembly body is connected to the substrate through engagement between the notch and the terminal.

9. The control unit having a press-fit structure according to claim 6, wherein the connector assembly body includes a plurality of press-fit terminals, and wherein the guide portion has a plurality of guide holes as the same number as the plurality of press-fit terminals.

10. The control unit having a press-fit structure according to claim 6, wherein the guide portion includes a fitting portion, wherein the substrate includes a fitted portion, and wherein the guide portion is positioned on the substrate through fitting of the fitting portion to the fitted portion.

11. The control unit having a press-fit structure according to claim 6, wherein the guide portion is molded integrally with the substrate.

12. The control unit having a press-fit structure according to claim 6, wherein the contact portion comprises an elastic leg portion having a hole passing through in a direction perpendicular to a longitudinal direction of the press-fit terminal between the tip end portion and the first enlarged portion, wherein the insertion hole is coated with a conductive member, and wherein the connector assembly body is connected to the substrate when the elastic leg portion is inserted into the insertion hole and at least a portion of the elastic leg portion is brought into contact with the conductive member of the insertion hole.

13. The control unit having a press-fit structure according to claim 12, wherein the guide portion is configured such that the guide hole is formed to have a center at such a position as to be aligned with a center of the insertion hole.

14. The control unit having a press-fit structure according to claim 12, wherein the guide portion includes an enlarged-hole portion formed on the substrate side of the reduced-hole portion.

15. The control unit having a press-fit structure according to claim 14, wherein the press-fit terminal is configured such that the elastic leg portion is positioned in the insertion hole under a state in which the second enlarged portion is held in contact with the inner wall of the reduced-hole portion.

16. The control unit having a press-fit structure according to claim 14, wherein the guide portion is configured such that the guide hole is formed to have a center at such a position as to be aligned with a center of the insertion hole.

17. The control unit having a press-fit structure according to claim 14, wherein the press-fit terminal is configured such that the elastic leg portion is positioned in the insertion hole when the second enlarged portion is positioned at the reduced-hole portion.

18. The control unit having a press-fit structure according to claim 17, wherein the press-fit terminal is configured such that the elastic leg portion is positioned in the insertion hole under a state in which the second enlarged portion is held in contact with the inner wall of the reduced-hole portion.

* * * * *